United States Patent
Murakawa

(10) Patent No.: US 10,340,147 B2
(45) Date of Patent: Jul. 2, 2019

(54) SEMICONDUCTOR DEVICE WITH EQUIPOTENTIAL RING CONTACT AT CURVED PORTION OF EQUIPOTENTIAL RING ELECTRODE AND METHOD OF MANUFACTURING THE SAME

(71) Applicant: Renesas Electronics Corporation, Koutou-ku (JP)

(72) Inventor: Kouichi Murakawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 198 days.

(21) Appl. No.: 14/995,597

(22) Filed: Jan. 14, 2016

(65) Prior Publication Data

US 2016/0126100 A1    May 5, 2016

Related U.S. Application Data

(63) Continuation of application No. 14/618,141, filed on Feb. 10, 2015, now Pat. No. 9,263,280, which is a
(Continued)

(30) Foreign Application Priority Data

Jun. 30, 2010    (JP) ................................. 2010-149510

(51) Int. Cl.
*H01L 29/06* (2006.01)
*H01L 21/283* (2006.01)
(Continued)

(52) U.S. Cl.
CPC ...... *H01L 21/283* (2013.01); *H01L 21/32133* (2013.01); *H01L 21/76802* (2013.01);
(Continued)

(58) Field of Classification Search
CPC ............. H01L 29/0619; H01L 29/7811; H01L 29/0615; H01L 29/0623; H01L 29/7395
See application file for complete search history.

(56) References Cited

U.S. PATENT DOCUMENTS 5,639,676 A * 6/1997 Hshieh .................. H01L 29/404
                                                         438/270
5,723,882 A    3/1998 Okabe et al.
(Continued)

FOREIGN PATENT DOCUMENTS

CN    101221980 A    7/2008
JP    5-019010 A    1/1993
(Continued)

OTHER PUBLICATIONS

Japanese Office Action dated Apr. 15, 2014 in corresponding Japanese Patent Application No. 2010-149510.
(Continued)

*Primary Examiner* — Jesse Y Miyoshi
(74) *Attorney, Agent, or Firm* — McDermott Will & Emery LLP

(57) ABSTRACT

A downsized semiconductor device having an excellent reverse characteristic, and a method of manufacturing the semiconductor device is sought to improve. The semiconductor device comprises a semiconductor body having a polygonal contour. An active area is formed in the semiconductor body. An EQR electrode is formed so as to surround the active area and to have curved portions of the EQR electrode along the corners of the semiconductor body. An interlayer insulating film is formed to cover the active area and the EQR electrode. The EQR electrode is embedded in the interlayer insulating film around the active area. EQR contacts are in contact with the curved portions of the EQR electrode and the semiconductor body outside the curved
(Continued)

portions, and have at least side walls covered with the interlayer insulating film.

19 Claims, 18 Drawing Sheets

Related U.S. Application Data continuation of application No. 13/164,866, filed on Jun. 21, 2011, now Pat. No. 9,000,538.

(51) Int. Cl.
  *H01L 29/40*  (2006.01)
  *H01L 29/417*  (2006.01)
  *H01L 29/66*  (2006.01)
  *H01L 29/78*  (2006.01)
  *H01L 21/768*  (2006.01)
  *H01L 21/3213*  (2006.01)
  *H01L 29/08*  (2006.01)
  *H01L 29/45*  (2006.01)

(52) U.S. Cl.
  CPC ...... *H01L 29/0638* (2013.01); *H01L 29/0692* (2013.01); *H01L 29/0847* (2013.01); *H01L 29/402* (2013.01); *H01L 29/41766* (2013.01); *H01L 29/66477* (2013.01); *H01L 29/66727* (2013.01); *H01L 29/66734* (2013.01); *H01L 29/7811* (2013.01); *H01L 29/7813* (2013.01); *H01L 29/0619* (2013.01); *H01L 29/0696* (2013.01); *H01L 29/456* (2013.01)

(56) References Cited

U.S. PATENT DOCUMENTS

| | | | | |
|---|---|---|---|---|
| 5,729,037 A * | 3/1998 | Hshieh | ............ | H01L 29/66712 257/329 |
| 5,883,416 A * | 3/1999 | Lin | ............ | H01L 29/42368 257/355 |
| 6,765,266 B2 * | 7/2004 | Ozeki | ............ | H01L 29/404 257/355 |
| 6,818,958 B2 * | 11/2004 | Spring | ............ | H01L 29/7802 257/395 |
| 7,582,918 B2 | 9/2009 | Takahashi | | |
| 7,732,821 B2 | 6/2010 | Suzuki et al. | | |
| 7,825,480 B2 | 11/2010 | Arai et al. | | |
| 8,008,734 B2 | 8/2011 | Wakimoto et al. | | |
| 8,093,923 B2 * | 1/2012 | Shimizu | ............ | H01L 27/0629 257/501 |
| 2006/0220166 A1 | 10/2006 | Kikuchi et al. | | |
| 2008/0135926 A1 | 6/2008 | Ono et al. | | |
| 2008/0169526 A1 | 7/2008 | Wakimoto et al. | | |
| 2009/0008708 A1 * | 1/2009 | Arai | ............ | H01L 29/402 257/330 |
| 2009/0090968 A1 * | 4/2009 | Ono | ............ | H01L 29/0619 257/341 |
| 2011/0014761 A1 * | 1/2011 | Arai | ............ | H01L 29/402 438/270 |

FOREIGN PATENT DOCUMENTS

| | | | |
|---|---|---|---|
| JP | 7-249765 | A | 9/1995 |
| JP | 3376209 | B2 | 2/2003 |
| JP | 3417336 | B2 | 6/2003 |
| JP | 3440987 | B2 | 8/2003 |
| JP | 4059566 | B2 | 3/2008 |
| JP | 2008-193043 | A | 8/2008 |
| JP | 2008-270440 | A | 11/2008 |
| JP | 2009-016482 | A | 1/2009 |

OTHER PUBLICATIONS

Japanese Office Action dated Jan. 13, 2015 in corresponding Japanese Patent Application No. 2010-149510.
Communication dated Jan. 7, 2015 from the State Intellectual Property Office of the People's Republic of China in counterpart application No. 201110186387.0.
Communication dated Jul. 30, 2018, issued by the State Intellectual Property Office of the People's Republic of China in counterpart application No. 201610312968.7

* cited by examiner

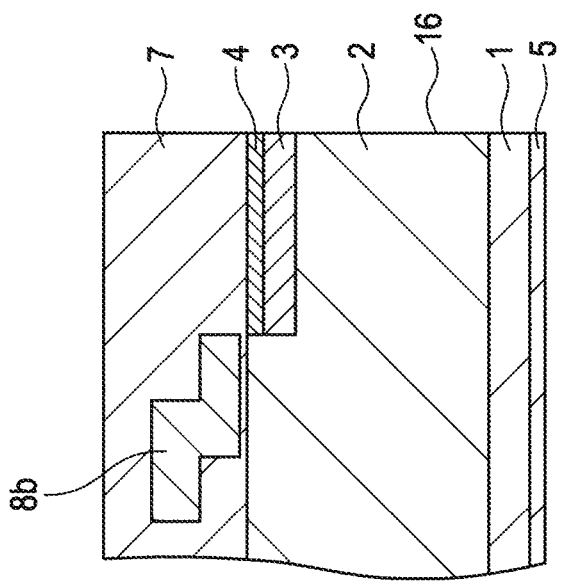
FIG. 10A2
CORNER PORTION
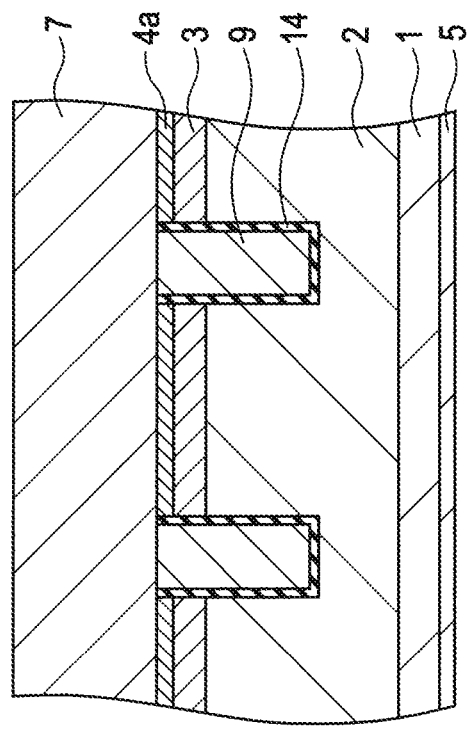
FIG. 10A1
ACTIVE AREA

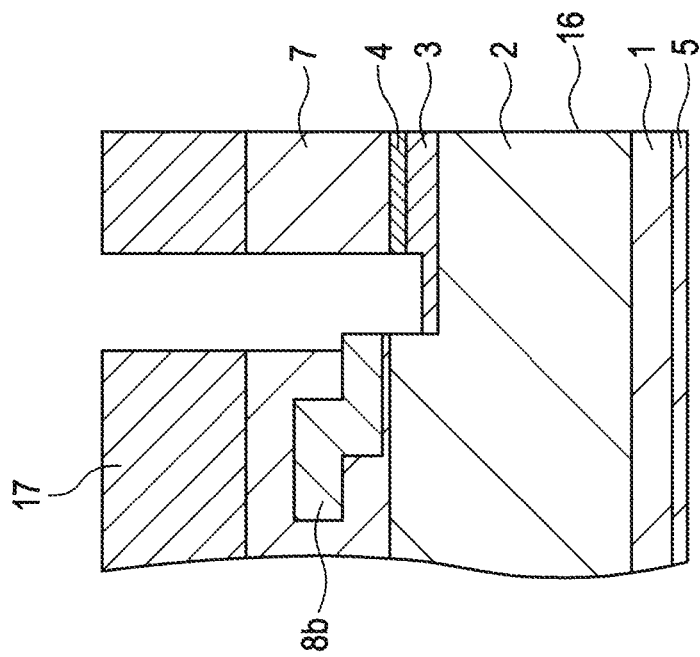
FIG. 10B2
CORNER PORTION
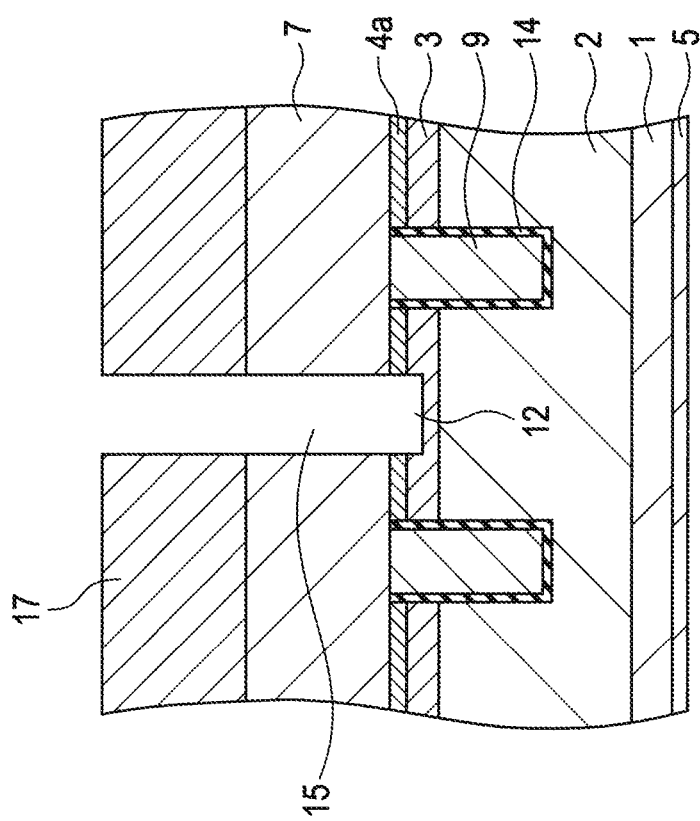
FIG. 10B1
ACTIVE AREA

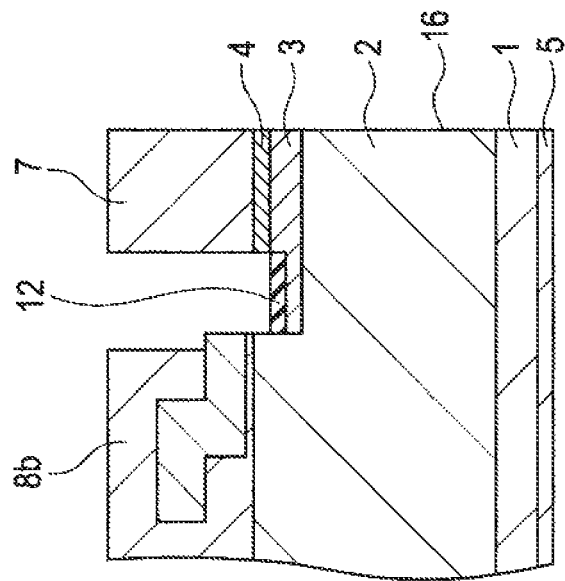
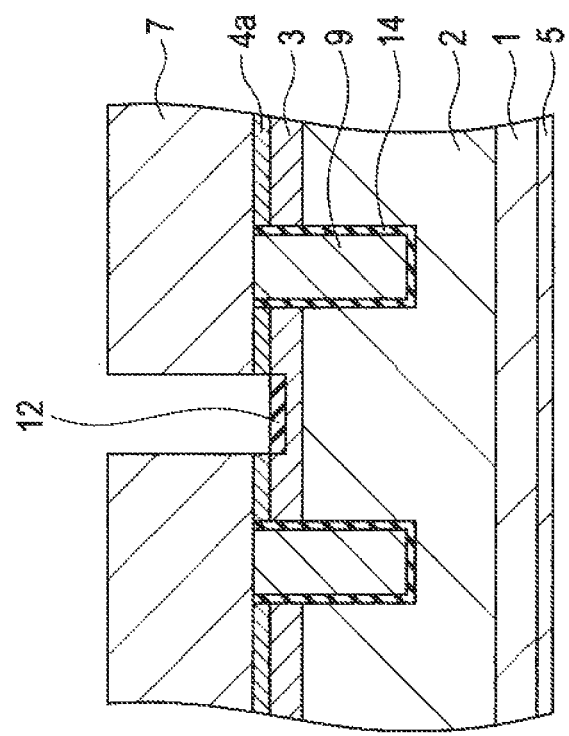
FIG. 10C1 ACTIVE AREA
FIG. 10C2 CORNER PORTION

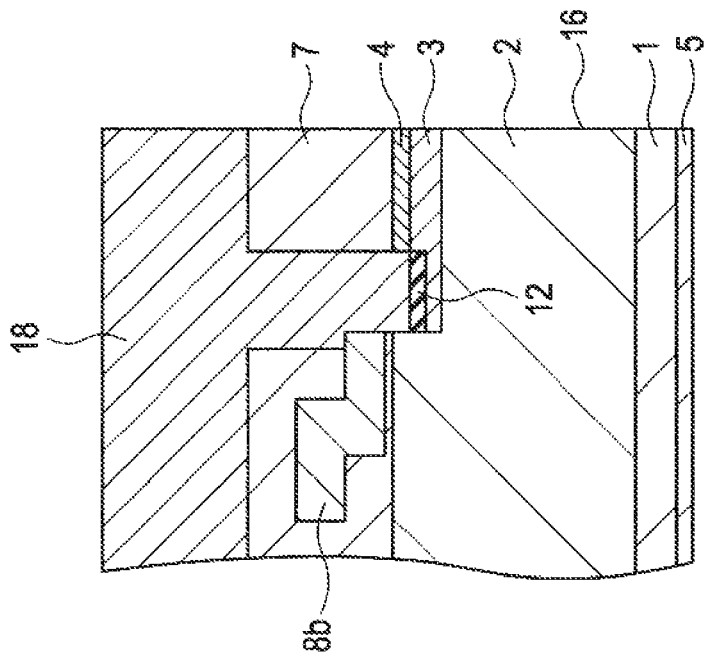
FIG. 10D2
CORNER PORTION
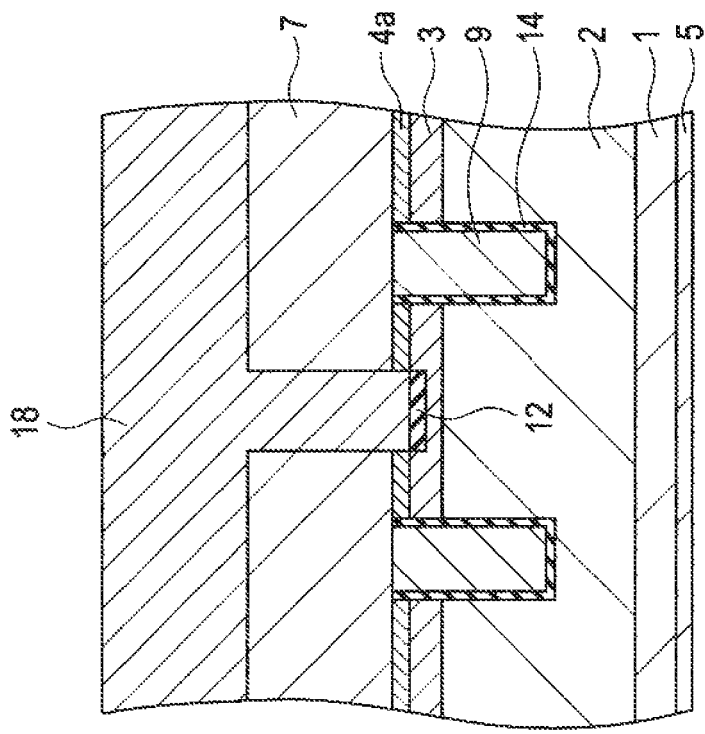
FIG. 10D1
ACTIVE AREA

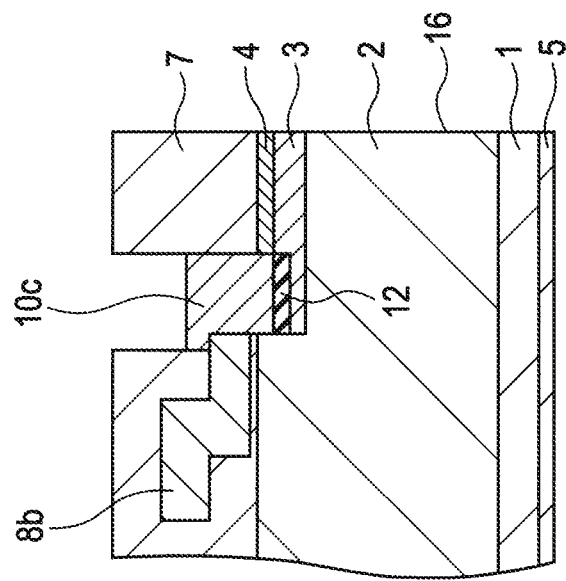
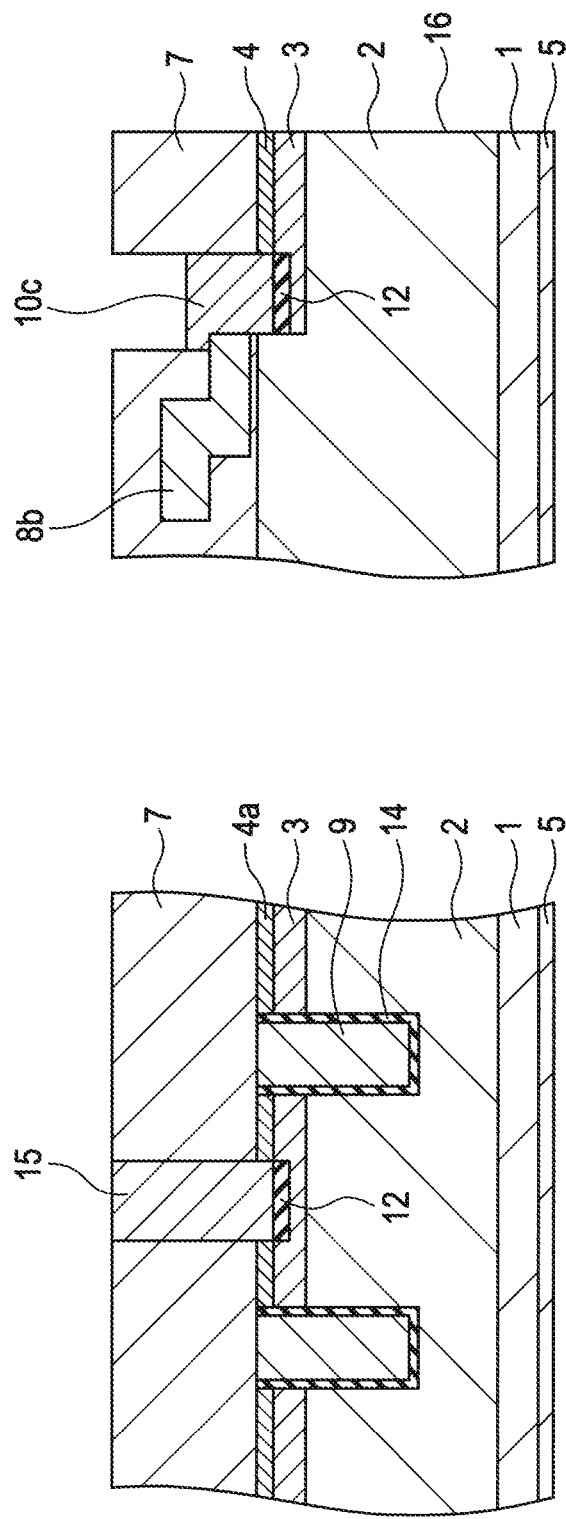

Related Art

US 10,340,147 B2

SEMICONDUCTOR DEVICE WITH EQUIPOTENTIAL RING CONTACT AT CURVED PORTION OF EQUIPOTENTIAL RING ELECTRODE AND METHOD OF MANUFACTURING THE SAME

CROSS-REFERENCE TO RELATED APPLICATIONS

This application is a continuation application of U.S. application Ser. No. 14/618,141, filed on Feb. 10, 2015, which is a Divisional Application of U.S. patent application Ser. No. 13/164,866, filed on Jun. 21, 2011, which claims priority from Japanese patent application No. 2010-149510 filed on Jun. 30, 2010, the contents of all of which are incorporated herein by reference in their entirety.

BACKGROUND

The present invention relates to a semiconductor device and a method of manufacturing the same, and more particularly to a semiconductor device excellent in reverse characteristic and a method of manufacturing the same.

In recent years, the use of a high voltage semiconductor element has been advanced. In general, in the high voltage semiconductor element, a ring-shaped EQR (equipotential ring) electrode is formed to surround an active area in which cells are arrayed is formed. If a drain potential of the EQR electrode is kept, expansion of a depletion layer toward the outside of the cell area is suppressed. A mechanism in which the expansion of the depletion layer is suppressed is generally called "channel stopper mechanism". The channel stopper mechanism is essential in obtaining an excellent reverse characteristic.

In a related-art high voltage semiconductor element, the EQR electrode includes two portions including a portion where the EQR electrode is formed on an interlayer insulating film, and a portion where the EQR electrode is embedded in the interlayer insulating film. Those two portions are electrically coupled to each other (Japanese Patent No. 3376209 and Japanese Patent No. 3440987). Also, there is a semiconductor element having a configuration in which the above two EQR electrodes are integrated together (Japanese Patent No. 4059566). Similarly, in this semiconductor element, a part of the EQR electrode is exposed to the interlayer insulating film.

A general high voltage semiconductor device will be described below. FIG. 13 is a plan view illustrating a configuration of a general high voltage semiconductor device 500. The semiconductor device 500 is of a rectangular contour, and has an active area 51 arranged in the center thereof. Cells such as MOSFETs (metal oxide semiconductor field effect transistor) are arranged in the active area 51. The active area 51 is covered with source electrodes (not shown) electrically coupled with the respective cells.

A ring-shaped second gate electrode 76 is formed apart from the active area 51 in an outer periphery of the active area 51. The second gate electrode 76 is electrically coupled to a first gate electrode 66 that will be described later. A ring-shaped second EQR electrode 73 is formed apart from the second gate electrode 76 in an outer periphery of the second gate electrode 76.

Subsequently, a cross-sectional structure of the semiconductor device 500 will be described. FIG. 14 is a cross-sectional view of the general high voltage semiconductor device 500 taken along a line XIV-XIV in FIG. 13. The semiconductor device 500 is sectioned into the active area 51 and a channel stopper area 52. In the semiconductor device 500, an $n^-$ type epitaxial layer 62 is formed over an $n^+$ type semiconductor substrate 61. A drain electrode 69 is formed on a rear surface side of the semiconductor substrate 61.

In the active area 51, a p type base diffusion region 63 is formed in an upper portion of the epitaxial layer 62. On a part of an upper surface side of the base diffusion region 63 are formed an $n^+$ type source diffusion region 64. A first gate electrode 66 is so formed as to apply a voltage to the base diffusion region 63 through a gate oxide film 65. An interlayer insulating film 67 is formed over the first gate electrode 66. A source electrode 68 that covers the active area 51 is electrically coupled to the source diffusion region 64.

In the channel stopper area 52, the base diffusion region 63 is formed in an upper portion of the epitaxial layer 62. An $n^+$ type channel stopper layer 71 is formed on a part of an upper surface side of the base diffusion region 63. The channel stopper layer 71 is the same layer as that of the source diffusion region 64. The gate oxide film 65 is formed over the base diffusion region 63 and the epitaxial layer 62 where the channel stopper layer 71 is not formed. A first EQR electrode 72 is formed over the gate oxide film 65. The first EQR electrode 72 is covered with the interlayer insulating film 67. An opening portion is formed in a part of the interlayer insulating film 67, and an upper surface of the first EQR electrode 72 is exposed. The second EQR electrode 73, which is electrically coupled to the exposed first EQR electrode 72, is formed over the interlayer insulating film 67 and the channel stopper layer 71.

In an area between the active area 51 and the channel stopper area 52, a field oxide film 74 is formed over the epitaxial layer 62. The field oxide film 74 is covered with the interlayer insulating film 67. An opening portion is formed in the interlayer insulating film 67 formed over the first gate electrode 66 extending from the active area 51. The second gate electrode 76 is so formed as to be electrically coupled to the first gate electrode 66 through the opening portion.

In the semiconductor device 500, when a reverse bias is applied between the source electrode 68 and the drain electrode 69, a depletion layer indicated by a broken line L1 expands toward the channel stopper area 52 from the active area 51.

On the other hand, in the channel stopper area 52, the channel stopper layer 71, the first EQR electrode 72, and the second EQR electrode 73 are electrically coupled to each other. Also, an end surface 75 of FIG. 14 is a surface formed by dicing and having a large number of defects. For that reason, the end surface 75 has an electrical conductivity. With this configuration, the channel stopper layer 71 and the drain electrode 69 are electrically connected to each other through the end surface 75. As a result, the first EQR electrode 72 is equipotential to the drain electrode 69.

When the first EQR electrode 72 is held to the drain potential, an inversion layer indicated by a broken line L2 is formed in the epitaxial layer 62 through the gate oxide film 65 formed below the first EQR electrode 72. With this configuration, a channel stopper structure is formed to stop an electric force line extending from the active area 51. As a result, in a voltage-current waveform, a hard breakdown shape (excellent reverse characteristic) is obtained.

Also, as another important characteristic of the high voltage semiconductor element, there are an on-resistance and a breakdown withstand voltage. The on-resistance mainly depends on a resistivity of the epitaxial layer, and can be reduced by increasing an impurity concentration in the epitaxial layer. However, when the impurity concentration of the epitaxial layer 62 increases, the breakdown withstand voltage decreases. That is, the on-resistance and the breakdown withstand voltage have a relationship of tradeoff. In order to avoid an influence of the tradeoff relationship, a cell shrink is applied to increase an on-state current per unit area so that a reduction in the on-resistance is realized.

On the other hand, there is a demand to reduce the on-resistance with the same chip size. To meet this demand, an attempt is made to enlarge a cell area (an area in which an element such as a transistor is formed). As one attempt, a method of reducing the channel stopper area has been proposed (Japanese Patent Application Publication No. 2008-270440).

Also, a technique in which a withstand voltage area (corresponding to the channel stopper area) is reduced with the use of a dead space of the semiconductor element has been proposed (Japanese Patent Application Publication No. 2008-193043). In this technique, a plurality of ring-shaped guard rings is formed over the semiconductor substrate around an active area. A ring-shaped first field plate having electric conductivity is formed over the guard ring. A second field plate formed of a metal film is formed over the guard ring. The second field plate is exposed to the interlayer insulating film. The second field plate is arranged on a portion of each corner of the semiconductor element in which the guard ring and the first field plate are curved. Since each corner of the semiconductor element is originally a dead space, the second field plate is arranged on the corner so that the width of the withstand voltage area can be narrowed, and the area of the active area can increase. Japanese Patent Application Publication No. Hei5(1993)-19010 and Japanese Patent No. 3417336 will be described later.

SUMMARY

In the above-mentioned semiconductor device, the active area is covered with the source electrode, and the ring-shaped gate electrode and EQR electrode are formed around the active area at given intervals. The gate electrode and the EQR electrode are covered with an insulating film often called "cover film". Further, in packaging in a post-process, a resin is deposited on the cover film. In general, a thickness of the cover film is thin as compared with respective distances among the source electrode, the gate electrode, and the EQR electrode. For that reason, the resin gets into spaces among the respective electrodes.

Under the above circumstances, when a temperature cycle test is conducted, a stress is applied to a surface side of the semiconductor device due to a difference in the thermal expansion coefficient between the semiconductor device per se and the resin. For that reason, the respective electrodes are pressed and stretched, resulting in displacement or peeling off of the electrodes. If the electrodes are made of aluminum, an influence of a thermal stress on the electric performances of the electrodes, such as aluminum slide (displacement of the electrodes), short-circuit of the adjacent electrodes, or the occurrence of disconnection, has been known (Japanese Patent Application Publication No. Hei 5(1993)-19010). There has been known that the influence of the thermal stress due to the resin is large at the corners of the semiconductor device. In order to solve this problem, for example, a technique in which an electrode is formed in an area other than the corners has been proposed (Japanese Patent No. 3417336).

That is, for example, as disclosed in Japanese Patent Application Publication No. 2008-193043, when the electrode is formed at the corners of the semiconductor device, the semiconductor device becomes brittle due to the influence of the thermal stress. Accordingly, up to now, the semiconductor device using the dead space while keeping the excellent reverse characteristic cannot be downsized.

According to one aspect of the present invention, there is provided a semiconductor device comprising: a semiconductor body that has a polygonal shape and has an active area including transistor elements formed therein; an insulating film that is formed over the semiconductor body; an EQR electrode that is embedded in the insulating film around the active area, and includes curved portions at corners of the polygonal shape; a source contact that is formed within the insulating film in the active area; and an EQR contact that is formed within the insulating film so as to contact the curved portions of the EQR electrode and the semiconductor body outside the curved portions.

In the semiconductor device, an upper surface of the EQR contact is lower in level than an upper surface of the insulating film and an upper surface of the source contact.

According to another aspect of the present invention, there is provided a method of manufacturing a semiconductor device which comprises an active area formed in a semiconductor body, the semiconductor body having a polygonal contour. The method, comprising: forming an EQR electrode over the semiconductor body so as to surround the active area, the EQR electrode having curved portions at corners of the polygonal contour; forming an insulating film that covers the semiconductor body and the EQR electrode; removing a part of the insulating film, and forming a source contact hole in the active area from which the semiconductor body is exposed, and EQR contact holes in the curved portions of the EQR electrode from which the EQR electrode and the semiconductor body outside the EQR electrode are exposed, at the same time, in which each of the EQR contact holes has an opening larger than that of the source contact hole; depositing a conductive material on the insulating film and within the source contact hole and the EQR contact holes; and etching the conductive material until an upper surface of the insulating film is exposed, forming a source contact and EQR contacts at the same time, in which an upper surface of the EQR contacts is lower in level than an upper surface of the insulating film and an upper surface of the source contact.

According to the present invention, a downsized semiconductor device having an excellent reverse characteristic, and a method of manufacturing the semiconductor device can be provided.

BRIEF DESCRIPTION OF THE DRAWINGS

FIG. 10A1 and FIG. 10A2 are a cross-sectional view illustrating a process of manufacturing the semiconductor device according to the third embodiment;

FIG. 10B1 and FIG. 10B2 are a cross-sectional view illustrating a process of manufacturing the semiconductor device according to the third embodiment;

FIG. 10C1 and FIG. 10C2 are a cross-sectional view illustrating a process of manufacturing the semiconductor device according to the third embodiment;

FIG. 10D1 and FIG. 10D2 are a cross-sectional view illustrating a process of manufacturing the semiconductor device according to the third embodiment;

FIG. 10E1 and FIG. 10E2 are a cross-sectional view illustrating a process of manufacturing the semiconductor device according to the third embodiment;

DETAILED DESCRIPTION

First Embodiment

Figure 1:
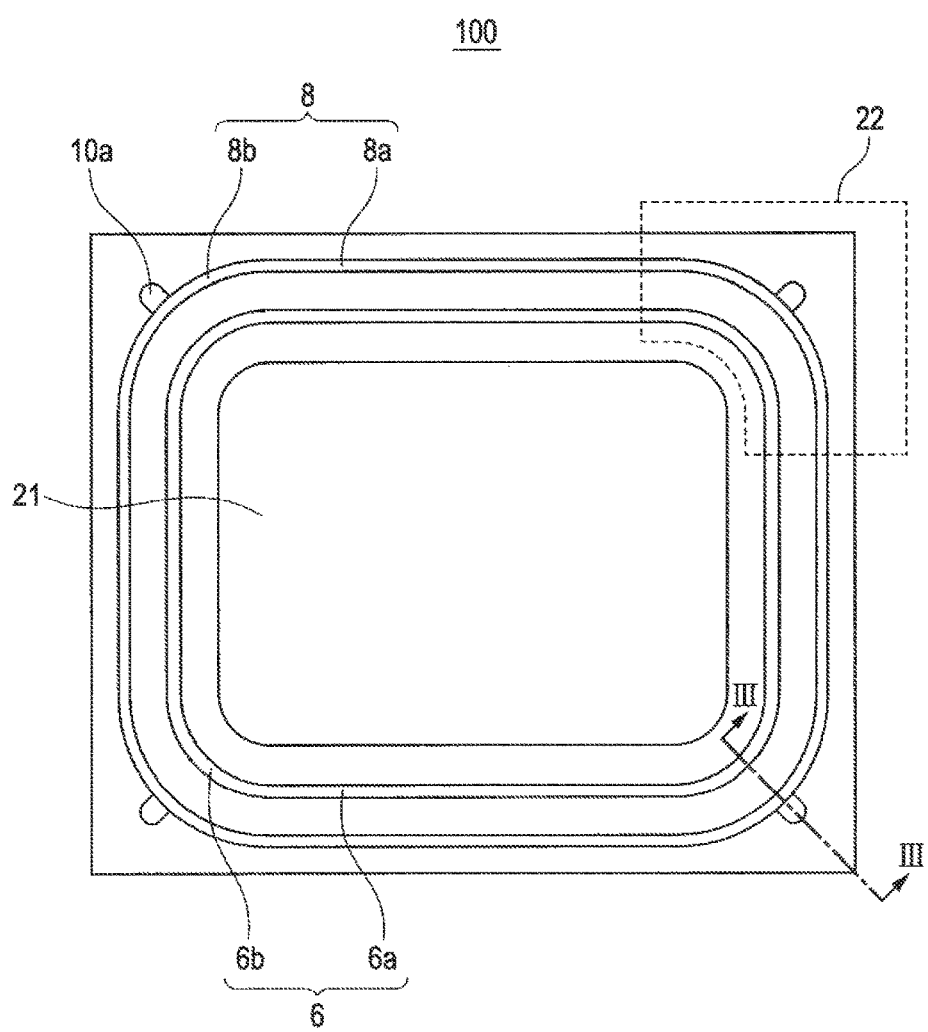
FIG. 1 is a plan view illustrating a structure of a semiconductor device according to a first embodiment.

Embodiments of the present invention will be described below with reference to the accompanying drawings. First, a semiconductor device according to a first embodiment will be described. FIG. 1 is a plan view illustrating a structure of a semiconductor device 100 according to a first embodiment. A semiconductor device 100 has a rectangular contour and has an active area 21 arranged in the center thereof. The active area 21 has, for example, cells such as MOSFETs or IGBTs (insulated gate bipolar transistor) arranged therein. The active area 21 is covered with a source electrode (not shown) connected with the respective cells.

A second gate electrode 6 is so formed as to surround the active area 21. The second gate electrode 6 is electrically coupled to a first gate electrode 9 that will be described later. An EQR electrode 8 is formed to be apart from the second gate electrode 6, and surround the active area 21 and the second gate electrode 6.

As described above, the semiconductor device 100 has a rectangular contour. For that reason, the second gate electrode 6 and the EQR electrode 8 are linearly shaped in areas along sides of the semiconductor device 100. On the other hand, the second gate electrode 6 and the EQR electrode 8 are curved along each corner 22 of the semiconductor device 100. That is, each of the second gate electrode 6 and the EQR electrode 8 has an annular shape in which linear portions and curved portions are coupled to each other. As illustrated in FIG. 1, the second gate electrode 6 is formed with linear portions 6a of the second gate electrode and curved portions 6b of the second gate electrode. The EQR electrode 8 is formed with linear portions 8a and of the EQR electrode and curved portions 8b of the EQR electrode.

Figure 2:
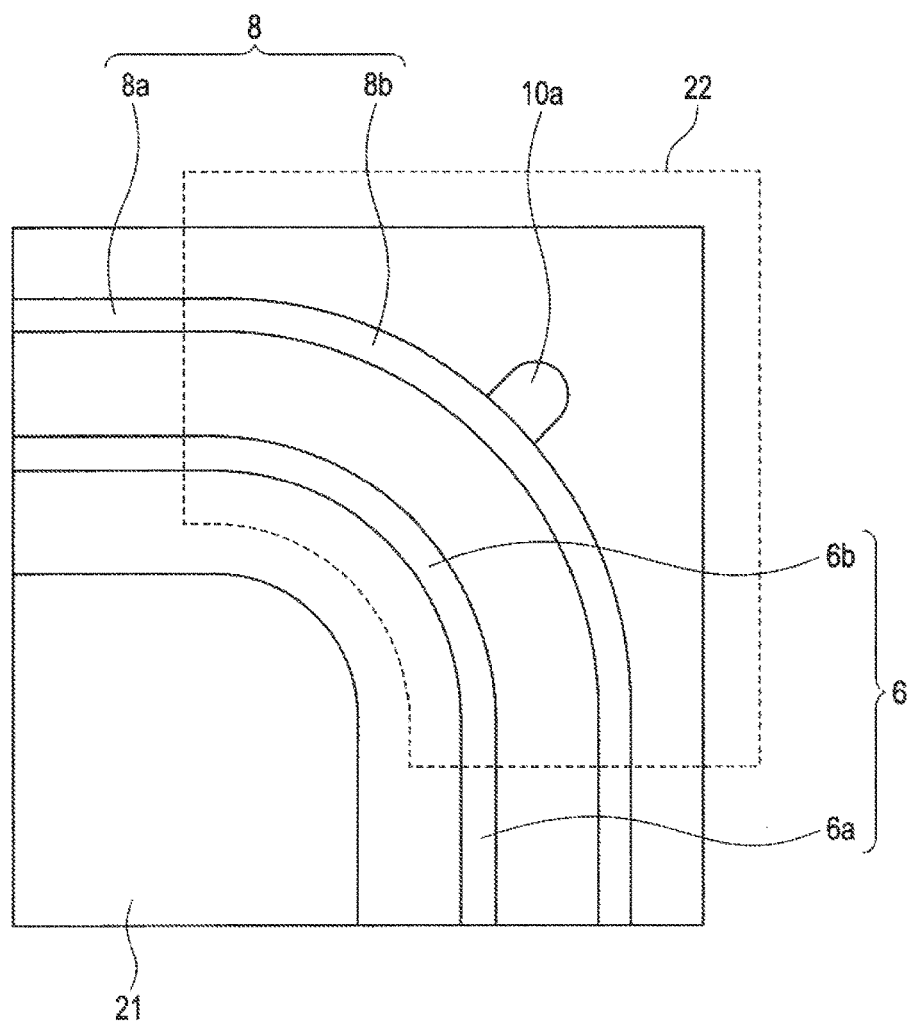
FIG. 2 is an enlarged plan view illustrating a corner of the semiconductor device according to the first embodiment.

FIG. 2 is an enlarged plan view illustrating the corner 22 of the semiconductor device 100 according to the first embodiment. As illustrated in FIGS. 1 and 2, each EQR contact 10a is in contact with an outer side of each curved portion 8b of the EQR electrode 8.

In FIGS. 1 and 2, the EQR electrode 8 and the EQR contacts 10a are covered with an interlayer insulating film 7 that will be described later. However, for description of the positions of the EQR electrode 8 and the EQR contacts 10a, the interlayer insulating film 7 is omitted from FIGS. 1 and 2.

Figure 3:
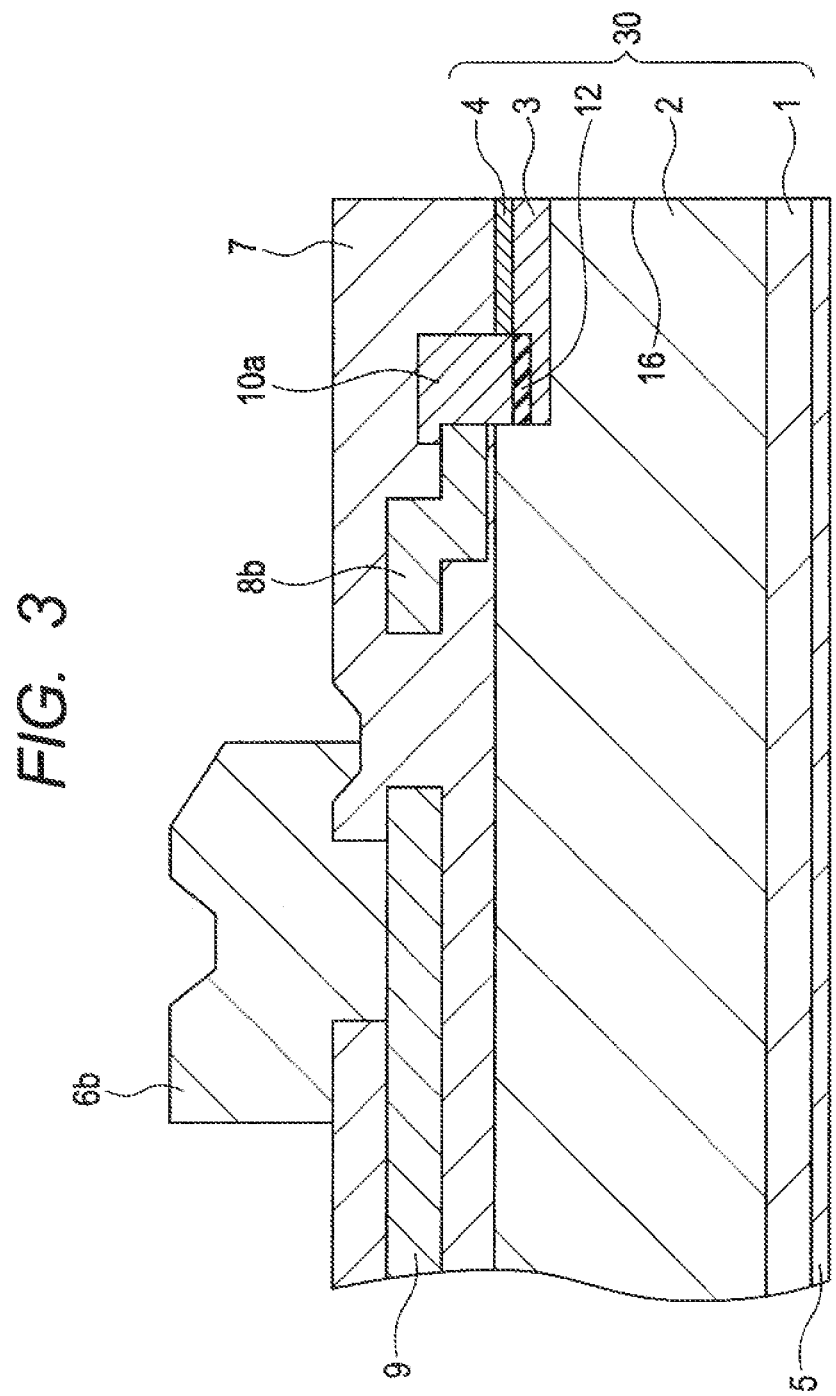
FIG. 3 is a cross-sectional view illustrating the semiconductor device taken along a line in FIG. 1 according to the first embodiment.

Subsequently, a cross-sectional structure of the semiconductor device 100 will be described. FIG. 3 is a cross-sectional view illustrating the semiconductor device 100 taken along a line III-III in FIG. 1 according to the first embodiment. In the semiconductor device 100, an epitaxial layer 2 is formed over a semiconductor layer 1. The semiconductor layer 1 is made of, for example, n type silicon substrate. The epitaxial layer 2 is made of, for example, n$^-$ type silicon layer. A base diffusion region 3 is formed in a part of the epitaxial layer 2. The base diffusion region 3 is made of, for example, p type silicon diffusion region. A high concentration diffusion region 12 is formed in a part of the base diffusion region 3. The high concentration diffusion region 12 is made of, for example, p$^+$ type silicon diffusion region. A drain electrode 5 is formed on a rear surface side of the semiconductor layer 1.

The interlayer insulating film 7 is formed over the epitaxial layer 2. The linear portions 8a and curved portions 8b of the EQR electrode (that is, the EQR electrode 8) and the first gate electrode 9 are embedded into the interlayer insulating film 7. The first gate electrode 9 is coupled to a gate of each cell arrayed in the active area 21. The EQR electrode 8 and the first gate electrode 9 are made of, for example, polysilicon layer.

An opening portion is formed in the interlayer insulating film 7 over the first gate electrode 9. The linear portions 6a and curved portions 6b of the second gate electrode (that is, the second gate electrode 6) extend from the opening portion over the interlayer insulating film 7. Hence, the first gate electrode 9 and the second gate electrode 6 are electrically coupled to each other. The second gate electrode 6 is made of, for example, aluminum layer.

Each EQR contact 10a that electrically couples the EQR electrode 8 to the high concentration diffusion region 12 is embedded in the interlayer insulating film 7. The EQR contact 10a is formed such as a tungsten plug. In an area extending from the EQR contact 10a to an end surface 16, a channel stopper layer 4 is formed between the base diffusion region 3 and the interlayer insulating film 7. The channel stopper layer 4 is made of, for example, n$^+$ silicon diffusion layer. Although not shown, in packaging the semiconductor device 100, a resin is deposited on the interlayer insulating film 7.

The semiconductor layer 1, the epitaxial layer 2, the base diffusion region 3, the channel stopper layer 4, and the high concentration diffusion region 12 are each made of a semiconductor material, and form a semiconductor body 30.

In this example, the EQR electrode 8 is electrically coupled to the drain electrode 5 through the EQR contact 10a, the channel stopper layer 4, and the end surface 16. Accordingly, the EQR electrode 8 is held equipotential to the drain electrode 5. With this configuration, a channel stopper structure is formed.

In the semiconductor device 100, as described above, the EQR electrode 8 is embedded in the interlayer insulating film 7. Further, the EQR contact 10a is embedded in the interlayer insulating film 7. That is, in the semiconductor device 100, the channel stopper structure is embedded in the interlayer insulating film 7. Hence, the EQR electrode 8 and the EQR contact 10a are not in contact with the resin deposited on the interlayer insulating film 7.

Hence, a thermal expansion of the resin deposited on the interlayer insulating film 7 can be reduced. Accordingly, according to this configuration, short-circuiting between the electrodes can be prevented, and the displacement and peeling off of the EQR contact 10a due to an influence of the thermal stress can be prevented.

Also, each EQR contact 10a is formed in the outer area of each curved portion 8b of the EQR electrode, which is originally the dead space (each corner 22 of the semiconductor device 100). Hence, there is no need to ensure an additional area for forming the EQR contacts 10a.

Therefore, according to this configuration, the downsized semiconductor device excellent in thermal stress resistance can be provided.

Second Embodiment

Figure 4:
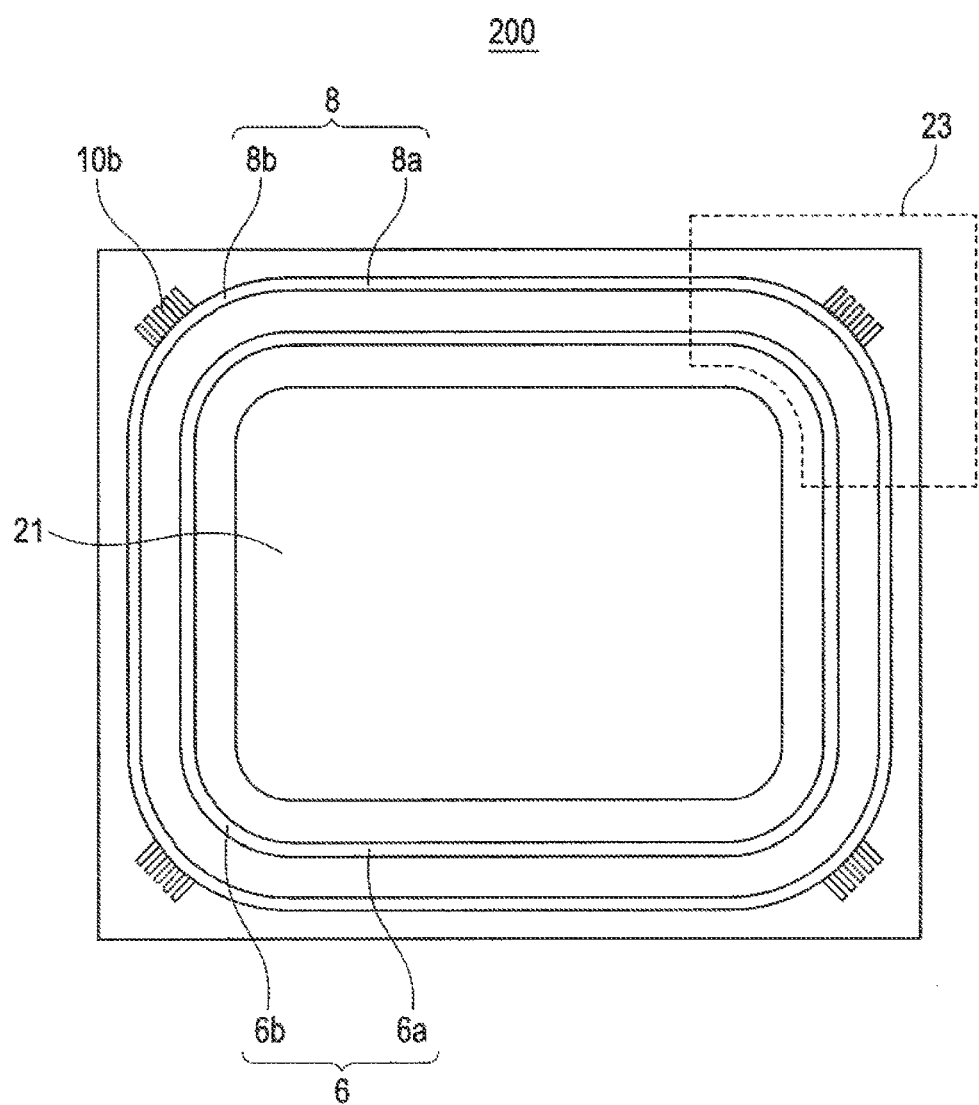
FIG. 4 is a plan view illustrating a structure of a semiconductor device according to a second embodiment.
Figure 5:
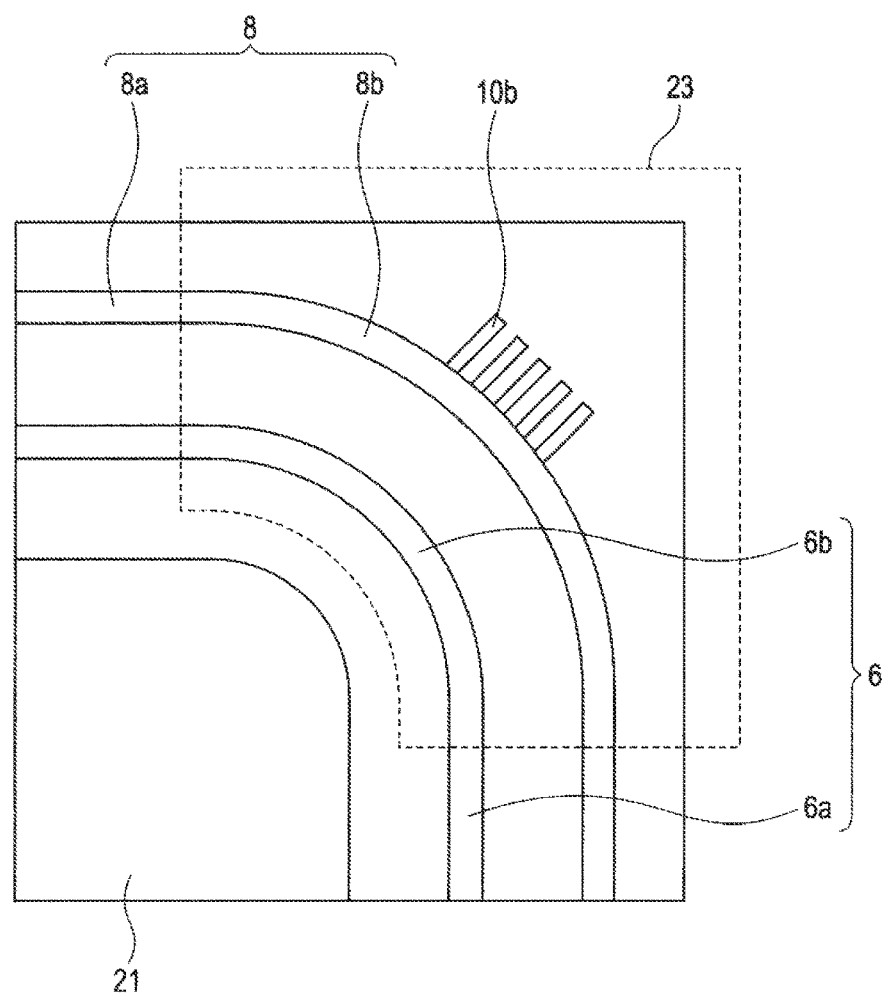
FIG. 5 is an enlarged plan view illustrating a corner of the semiconductor device according to the second embodiment.

Subsequently, a semiconductor device according to a second embodiment will be described. FIG. 4 is a plan view illustrating a structure of a semiconductor device 200 according to the second embodiment. FIG. 5 is an enlarged plan view illustrating each corner 23 of the semiconductor device 200 according to the second embodiment. As illustrated in FIGS. 4 and 5, in the semiconductor device 200, the EQR contact 10a of the semiconductor device 100 is replaced with EQR contacts 10b. The other configurations of the semiconductor device 200 are identical with those in the semiconductor device 100, and their description will be omitted. Also, a cross-sectional structure of the semiconductor device 200 is identical with the cross-sectional structure of the semiconductor device 100 illustrated in FIG. 3, and therefore its description will be omitted.

At each corner 23, the EQR contacts 10b extend in a direction normal to the outer side of the EQR electrode 8. Each EQR contact 10b is formed in a rectangular shape, and each long side extends along a normal direction of the EQR electrode 8. A plurality of the EQR contacts 10b is formed in parallel.

In FIGS. 4 and 5, the EQR electrode 8 and the EQR contact 10b are covered with the interlayer insulating film 7. However, for description of the positions of the EQR electrode 8 and the EQR contacts 10b, the interlayer insulating film 7 is omitted from FIGS. 4 and 5.

According to this configuration, the EQR contacts 10b are formed at each corner. Hence, as compared with a case in which only one EQR contact is formed, a margin for formation defect of the EQR contacts can be ensured. That is, even if the formation defect occurs in a part of the EQR contacts, the normally formed EQR contacts can function as the EQR contact.

Also, if a width of each strip electrode configuring the EQR contact 10b is narrowed, the EQR contact 10b can be made of the same material as that of a trench source contact 15 formed in each transistor cell in the active area. With miniaturization of the transistor cell, when the width of the trench source contact 15 is narrowed (for example, 0.8 μm), aluminum cannot be embedded. Hence, for example, a material excellent in the embedding property such as tungsten is used. The width of the EQR contact 10b may be set to such a width that the conductive material to be embedded is sufficiently satisfactorily embedded.

With an improvement of the embedding property, in formation of the EQR contact 10b by etching back after the metal has been deposited, the thickness of the EQR contact 10b can be sufficiently ensured. In addition, with the narrowed width of the strip electrode, the thermal stress exerted by the resin deposited on the interlayer insulating film 7 in a post-process can be further reduced.

Third Embodiment

Figure 6:
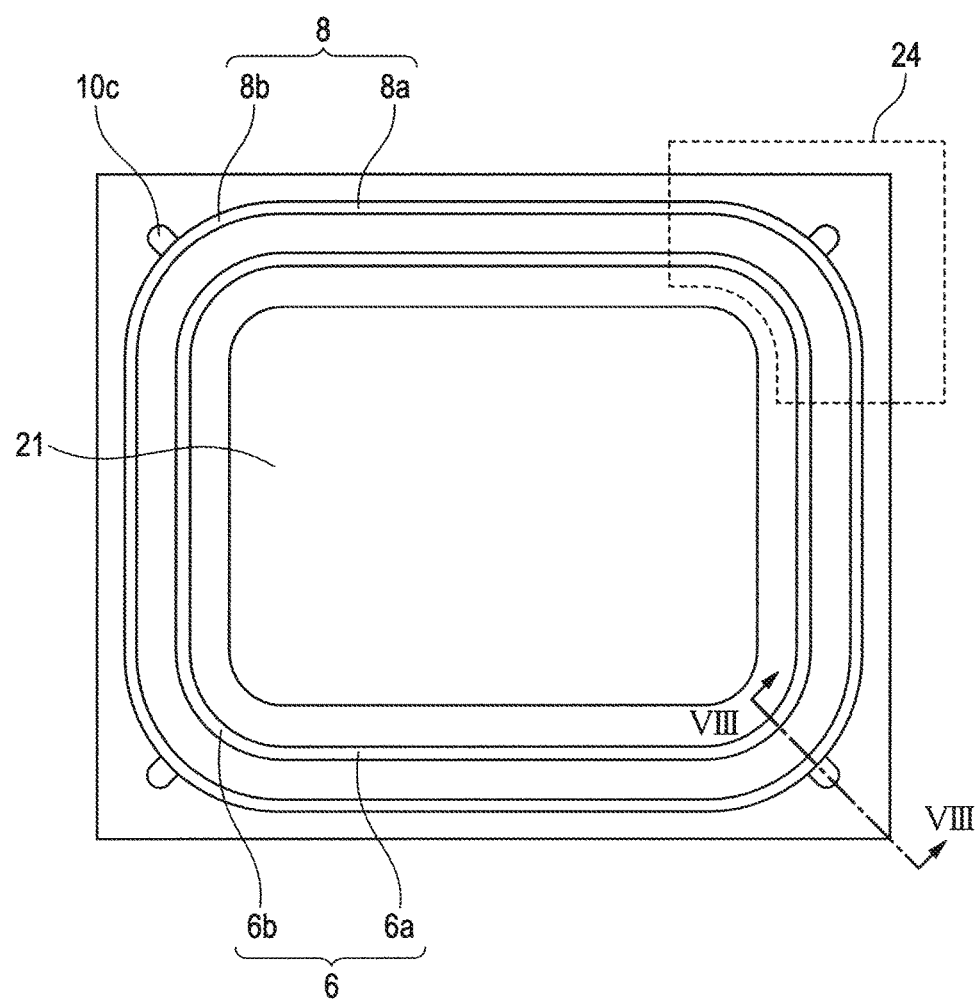
FIG. 6 is a plan view illustrating a structure of a semiconductor device according to a third embodiment.
Figure 7:
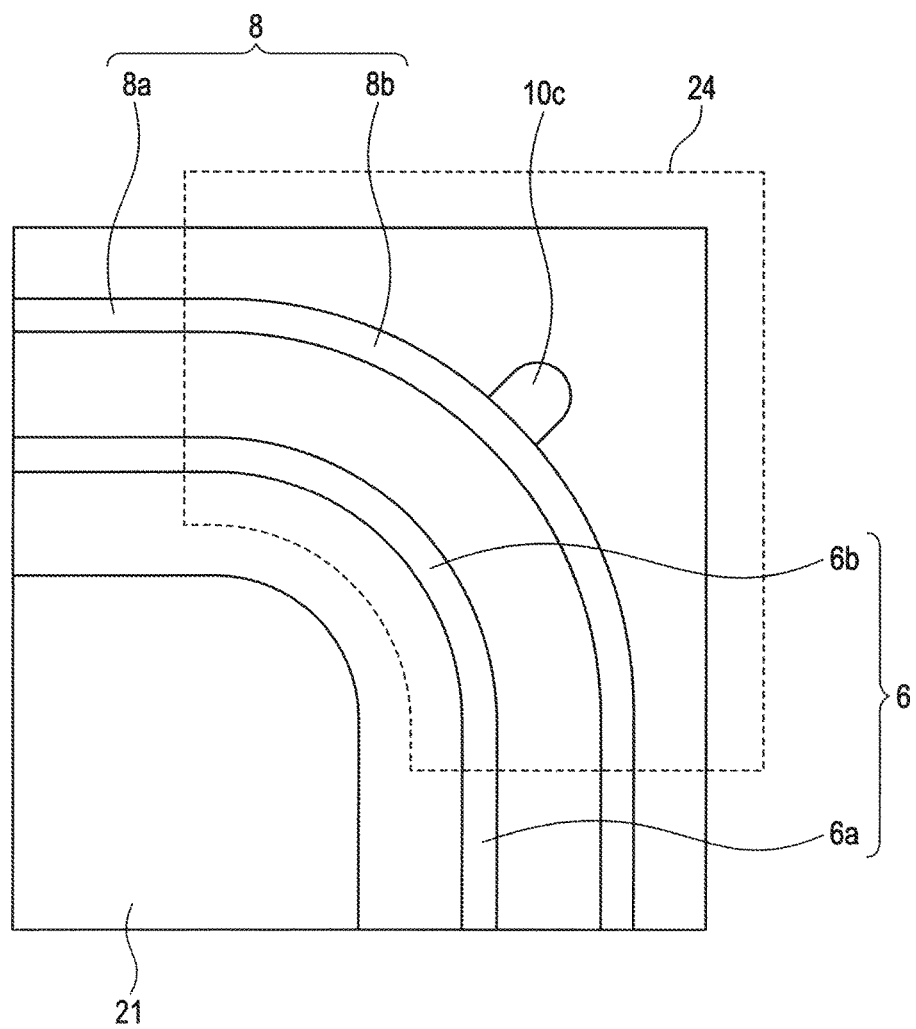
FIG. 7 is an enlarged plan view illustrating a corner of the semiconductor device according to the third embodiment.

A semiconductor device according to a third embodiment will be described below. FIG. 6 is a plan view illustrating a structure of a semiconductor device 300 according to a third embodiment. FIG. 7 is an enlarged plan view illustrating each corner 24 of the semiconductor device 300 according to the third embodiment. As illustrated in FIGS. 6 and 7, in the semiconductor device 300, the EQR contact 10a of the semiconductor device 100 is replaced with an EQR contact 10c. The other configurations of the semiconductor device 300 are identical with those in the semiconductor device 100, and their description will be omitted.

In FIGS. 6 and 7, the EQR electrode 8 is covered with the interlayer insulating film 7. However, for description of the position of the EQR electrode 8, the interlayer insulating film 7 is omitted from FIGS. 6 and 7.

Figure 8:
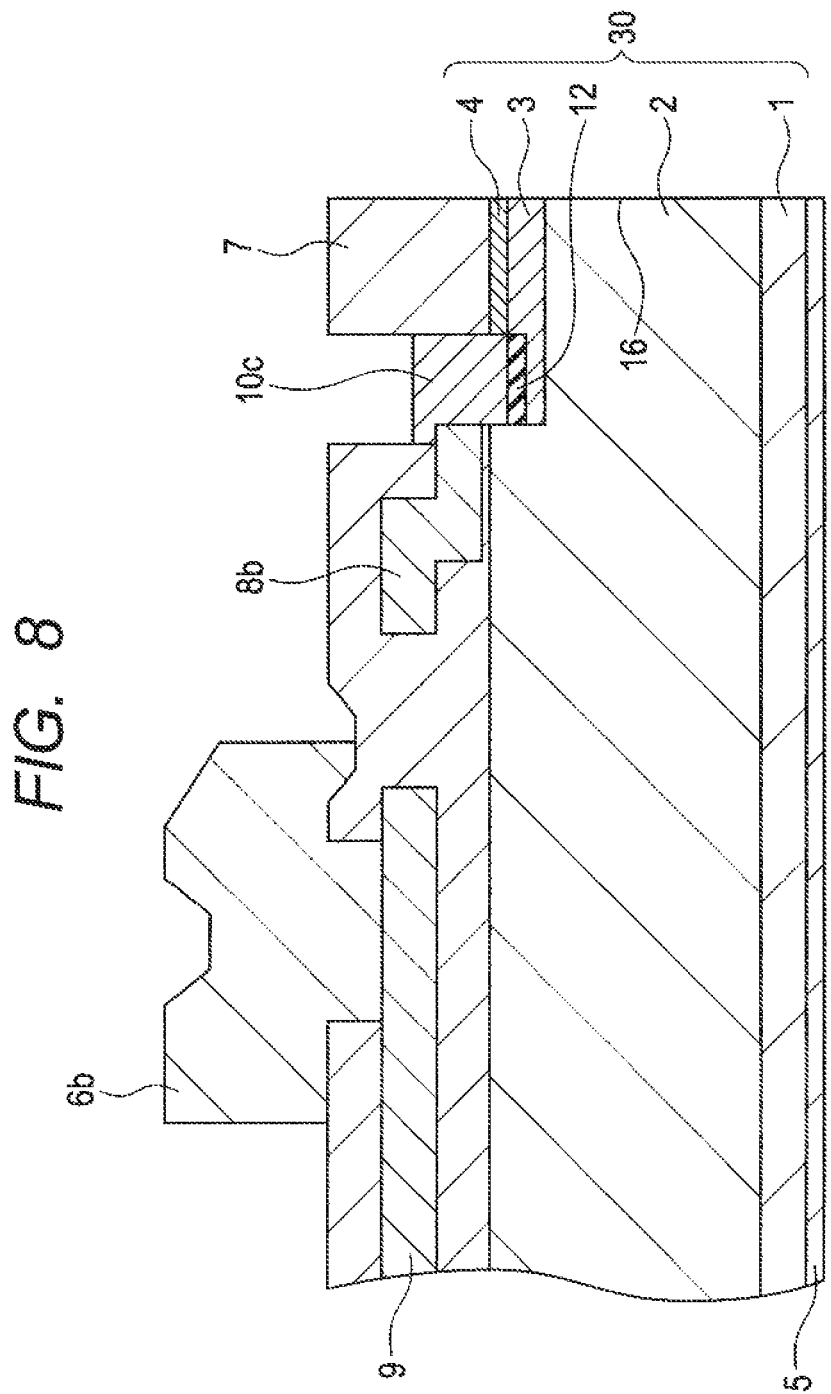
FIG. 8 is a cross-sectional view illustrating the semiconductor device taken along a line VIII-VIII in FIG. 6 according to the third embodiment.

A cross-sectional structure of each corner in the semiconductor device 300 will be described below. FIG. 8 is a cross-sectional view illustrating the semiconductor device 300 taken along a line VIII-VIII in FIG. 6 according to the third embodiment. As compared with the EQR contact 10a of the semiconductor device 100, each EQR contact 10c is exposed without an upper portion thereof being covered with the interlayer insulating film 7. Also, side walls of the EQR contact 10c are in contact with the interlayer insulating film 7 and the EQR electrode 8. The other cross-sectional structures of the semiconductor device 300 are identical with those of the semiconductor device 100, and therefore, their description will be omitted.

Figure 9:
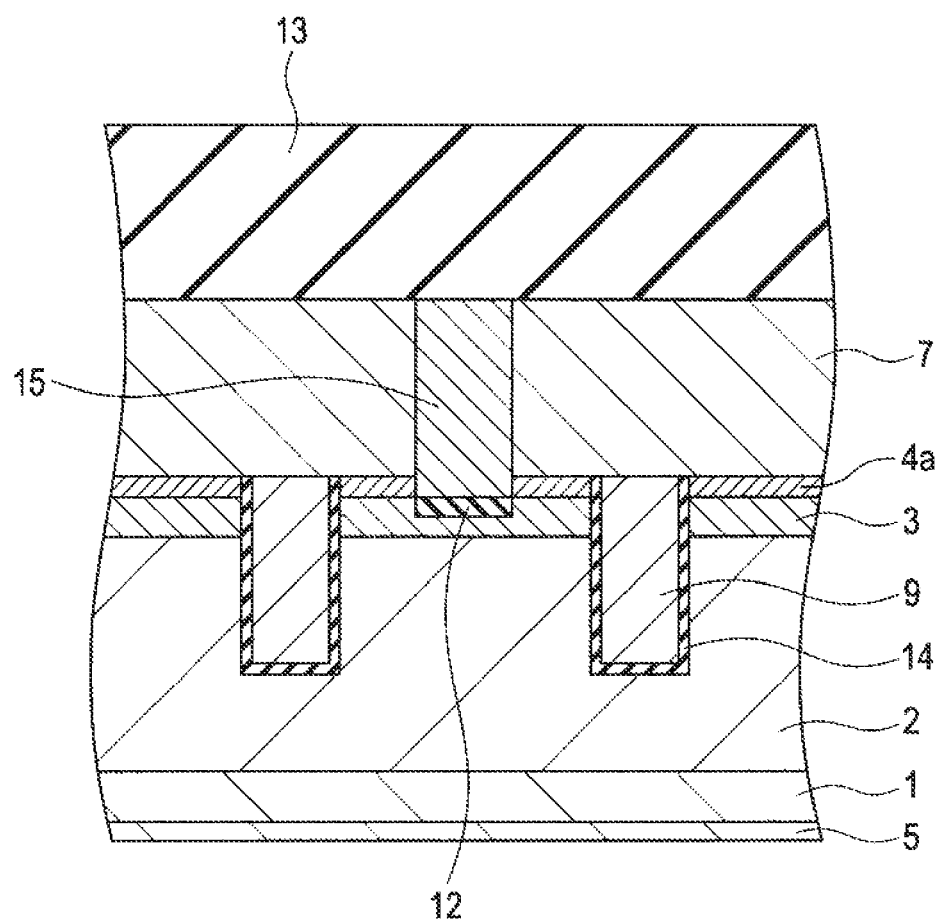
FIG. 9 is a cross-sectional view illustrating an active area of the semiconductor device according to the third embodiment.

A cross-sectional structure of each cell disposed in the active area 21 of the semiconductor device 300 will be described below. FIG. 9 is a cross-sectional view illustrating the active area 21 of the semiconductor device 300 according to the third embodiment. Each cell in the active area 21 is of a trench gate structure.

In the active area 21, the epitaxial layer 2 is formed on the semiconductor layer 1. The drain electrode 5 is formed on a rear surface side of the semiconductor layer 1. The base diffusion region 3 and a source diffusion region 4a are formed in an upper portion of the epitaxial layer 2 in order. In this example, the source diffusion region 4a is the same layer as the channel stopper layer 4. The first gate electrode 9 penetrates through the base diffusion region 3 and the source diffusion region 4a, and reaches the epitaxial layer 2. A gate oxide film 14 is formed between the base diffusion region 3, the source diffusion region 4a, and the epitaxial layer 2, and the first gate electrode 9. In FIG. 9, although not shown, the first gate electrode 9 extends to the outside of the active area 21, and is electrically coupled to the second gate electrode 6. The interlayer insulating film 7 covering those structures is formed.

The high concentration diffusion region 12 is formed in an upper portion of the base diffusion region 3 in an area sandwiched by the first gate electrode 9. The trench source contact 15 penetrates the interlayer insulating film 7 and the source diffusion region 4a, and is electrically coupled to the high concentration diffusion region 12. A source electrode 13 is formed over the interlayer insulating film 7 and the trench source contact 15. The source electrode 13 and the trench source contact 15 are electrically coupled to each other.

A method of manufacturing the semiconductor device 300 will be described below. FIGS. 10A1 to 10E2 are cross-sectional views illustrating a process of manufacturing the semiconductor device 300 according to the third embodiment. In FIGS. 10A1 to 10E2, cross-sectional structures of the active area and the corner disposed in the active area 21 are illustrated side by side.

First, the epitaxial layer 2 is formed on the semiconductor layer 1. Then, the base diffusion region 3, the channel stopper layer 4, and the source diffusion region 4a are formed in an upper portion of the epitaxial layer 2 in the stated order. The base diffusion region 3, the channel stopper layer 4, and the source diffusion region 4a can be respectively formed by, for example, forming a resist mask (not shown) over the epitaxial layer 2, and thereafter implanting ions therein. Then, in the active area 21, the first gate electrode 9, the gate oxide film 14, and the interlayer insulating film 7 are formed as in FIG. 10A1. The EQR electrode 8 embedded in the interlayer insulating film 7 is formed at each corner (FIG. 10A2).

Subsequently, a resist mask 17 is formed over the interlayer insulating film 7. The resist mask 17 is formed through, for example, photolithography. In the resist mask 17, an opening portion is formed in an area where the trench source contact 15 in the active area 21 is formed in the interlayer insulating film 7, and an area where the EQR contact 10a at the corner is simultaneously formed. Then, etching is conducted with the use of the resist mask 17 to remove the source diffusion region 4a (FIG. 10B1) and the channel stopper layer 4 (FIG. 10B2). In this situation, etching is executed so that the base diffusion region 3 is not pierced.

Subsequently, the high concentration diffusion region 12 is formed in an upper portion of the base diffusion region. The high concentration diffusion region 12 is formed by, for example, implanting p type dopant ions such as boron. The ion implantation is conducted under the conditions in which the dose is $3 \times 10^{16}$ ions/cm$^2$, and an implant energy is 50 keV. Then, after the formation of the high concentration diffusion region 12, the resist mask 17 is removed (FIGS. 10C1 and 10C2).

Subsequently, a tungsten layer 18 is deposited so that the opening portion is filled with the tungsten layer 18 (FIGS. 10D1 and 10D2). A barrier metal such as titanium/titaniumnitride may well be deposited before depositing the tungsten layer 18. Then, the tungsten layer 18 is etched until an upper surface of the tungsten layer 18 are aligned with an upper surface of the interlayer insulating film 7 to form the trench source contact 15. In this situation, the tungsten layer 18 deposited at the corner is etched in the same manner. Incidentally, the opening portion of each corner is larger in area than the opening portion of the active area 21. For that reason, an etching rate of the opening portion of the corner is higher than that of the active area 21. As a result, the upper surface of the EQR contact 10c at the corner is lower than the upper surface of the trench source contact 15 (FIGS. 10E1 and 10E2). As a result, the side surfaces of the EQR contact 10c are formed in touch with the EQR electrode 8 and the interlayer insulating film 7, and the upper surface of the EQR contact 10c is lowered than that of the interlayer insulating film 7. Thereafter, the source electrode 13 is electrically coupled to the trench source contact 15. Thereafter, the upper surface of the EQR contact is covered with a cover film (not shown).

That is, according to this configuration and this manufacturing method, the EQR contact 10c and the trench source contact 15 can be formed at the same time. Hence, there is no need to add a process for forming the EQR contact 10c. Therefore, according to this configuration and this manufacturing method, the downsized semiconductor device excellent in the thermal stress resistance can be realized at the low costs.

Fourth Embodiment

Figure 11:
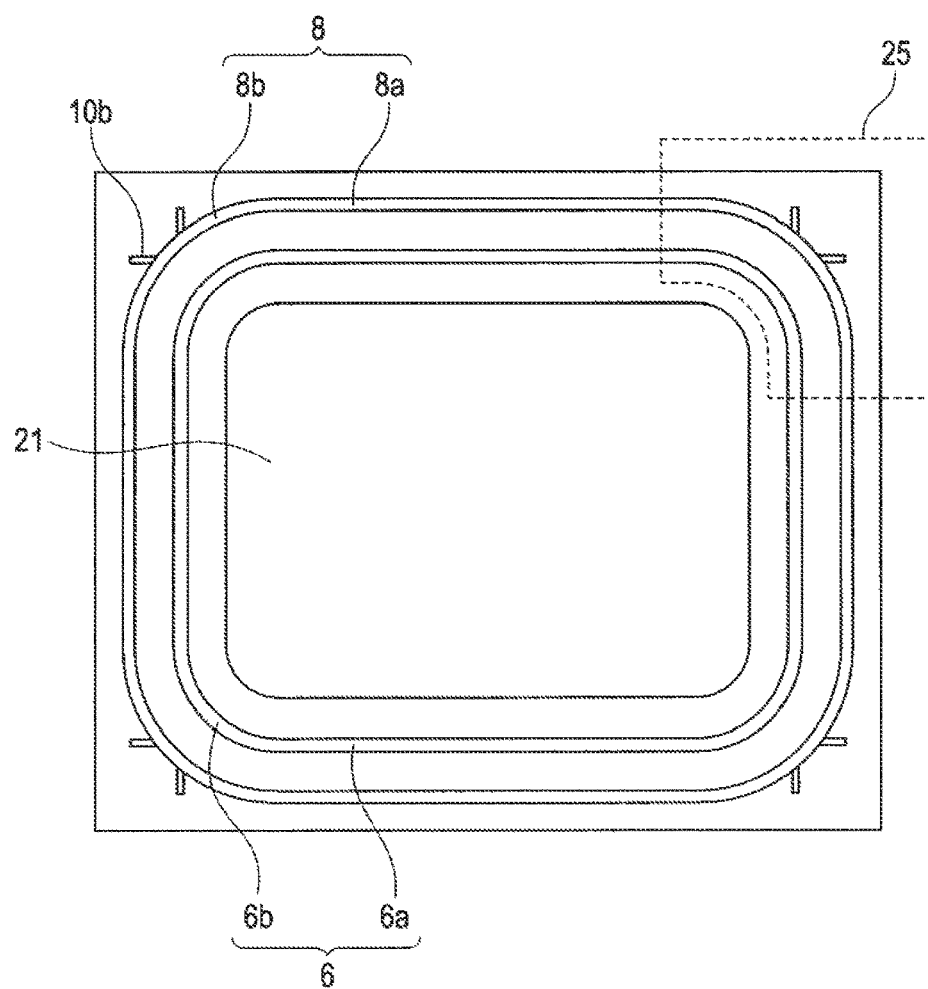
FIG. 11 is a plan view illustrating a structure of a semiconductor device according to a fourth embodiment.
Figure 12:
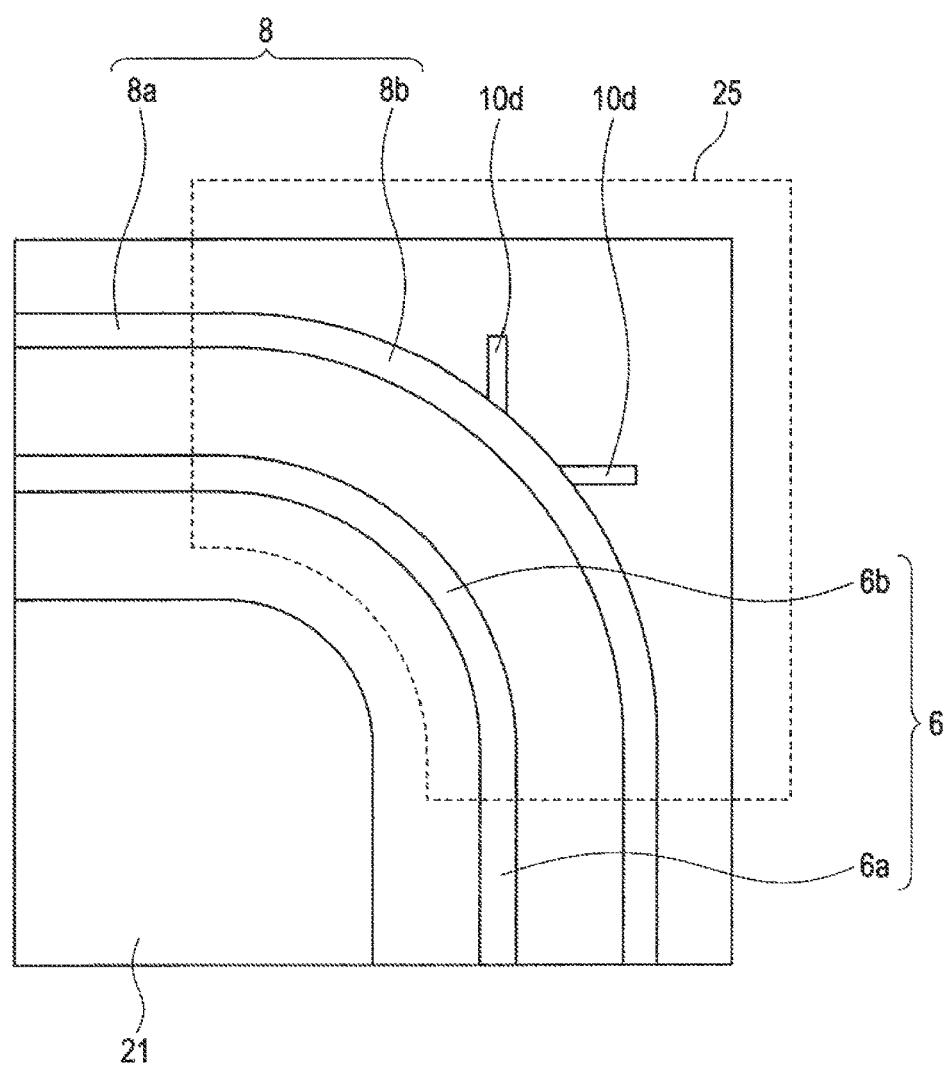
FIG. 12 is an enlarged plan view illustrating a corner of the semiconductor device according to the fourth embodiment.
Figure 13:
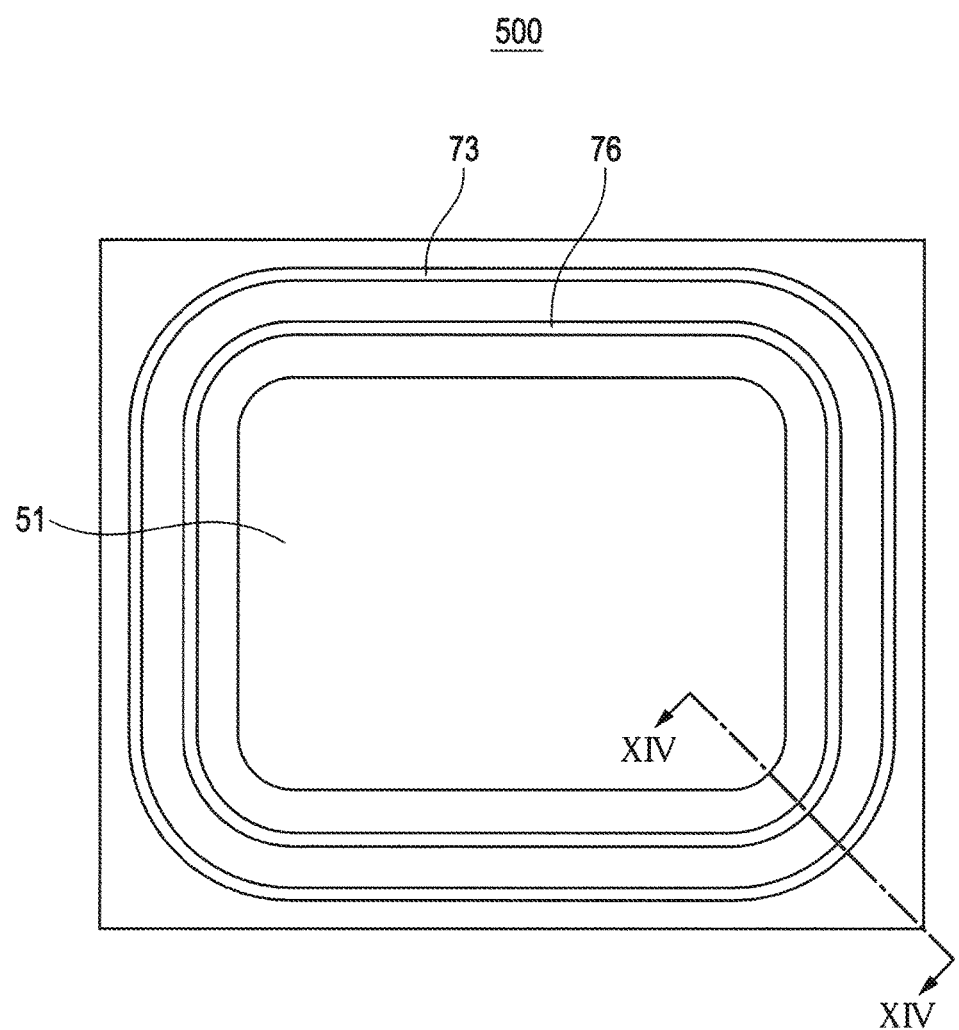
FIG. 13 is a plan view illustrating a configuration of a general high voltage semiconductor device.
Figure 14:
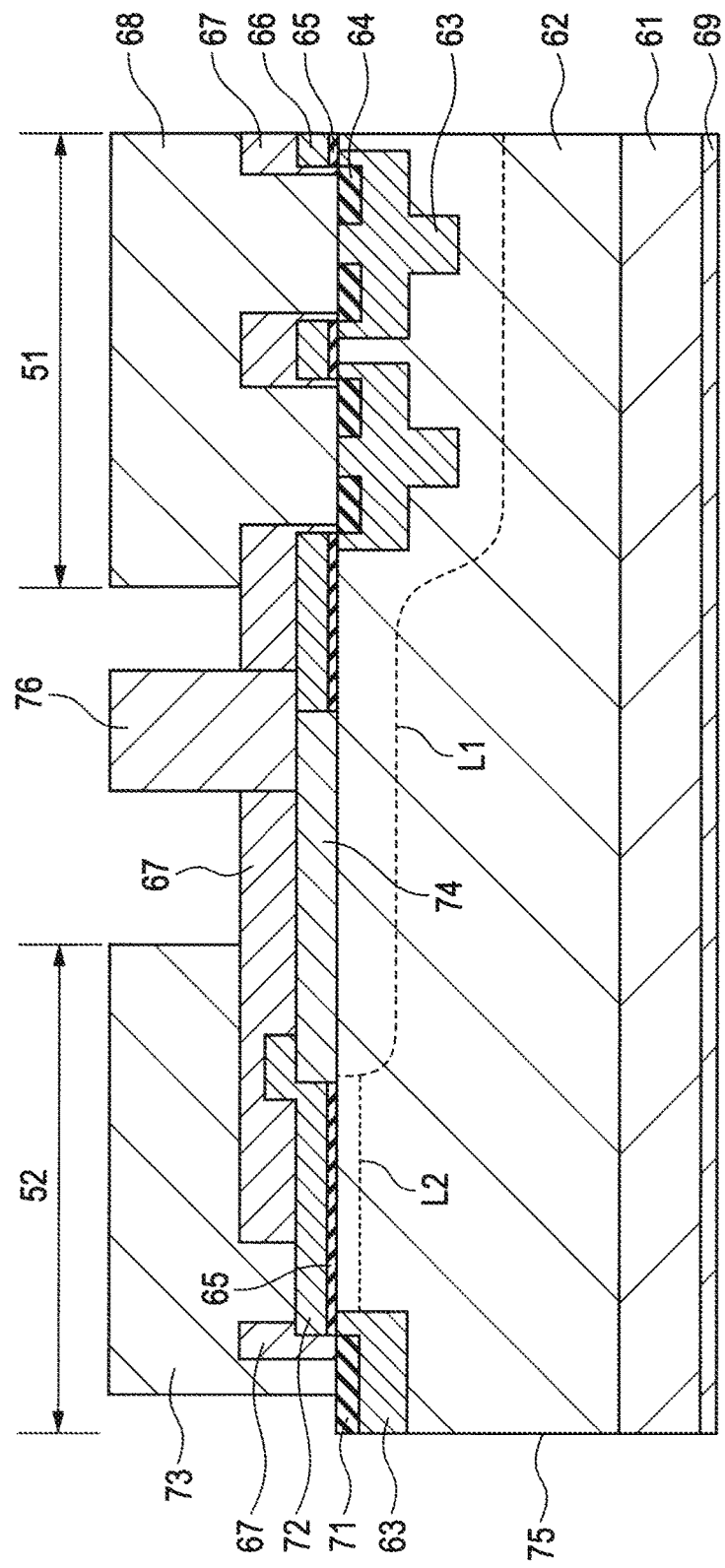
FIG. 14 is a cross-sectional view illustrating the general high voltage semiconductor device taken along a line XIV-XIV in FIG. 13.

A semiconductor device according to a fourth embodiment will be described below. FIG. 11 is a plan view illustrating a structure of a semiconductor device 400 according to a fourth embodiment. FIG. 12 is an enlarged plan view illustrating each corner 25 of the semiconductor device 400 according to the fourth embodiment. As illustrated in FIGS. 11 and 12, in the semiconductor device 400, the EQR contact 10a of the semiconductor device 100 is replaced with EQR contacts 10d. The other configurations of the semiconductor device 400 are identical with those in the semiconductor device 100, and their description will be omitted. Also, a cross-sectional structure of the semiconductor device 400 is identical with the cross-sectional structure of the semiconductor device 100 illustrated in FIG. 3.

In the semiconductor device 400, the EQR contact 10d is formed in a rectangular shape. Two EQR contacts 10d are formed at one corner. The two EQR contacts 10d are inclined in different directions with respect to a normal direction to each curved portion 8b of the EQR electrode, respectively. Each width of those two EQR contacts 10d is about 0.6 μm.

Other Embodiments

The present invention is not limited to the above embodiment, can be appropriately changed without departing from the subject matter of the present invention. For example, the EQR contacts 10a to 10d are not limited to tungsten. The EQR contacts 10a to 10d can be made of another material having conductivity. Hence, the EQR contacts 10a to 10d can be made of, for example, aluminum.

The upper surfaces of the above-mentioned EQR contacts 10a, 10b and 10d are covered with the interlayer insulating film 7. However, like the EQR contact 10c, the upper surfaces of the EQR contacts 10a, 10b and 10d may not be covered with the interlayer insulating film 7. Accordingly, the EQR contacts 10b and 10d can be produced in the manufacturing process illustrated in FIGS. 10A1 to 10E2.

In the above-described first to fourth embodiments, the EQR contacts 10a to 10d are formed over the high concentration diffusion region 12. However, if the EQR contacts 10a to 10d are held equipotential to the drain electrode 5, the high concentration diffusion region 12 that is in contact with the EQR contacts 10a to 10d is not always required, and can be omitted.

Also, in the above-described first to fourth embodiments, the channel stopper layer 4 is formed between the EQR contacts 10a to 10d and the end surface 16. The electric force line from the chip end surface can be stopped by the channel stopper layer 4. Accordingly, there can be provided the downsize semiconductor device excellent in the reverse characteristic and the method of manufacturing such a semiconductor device. However, if only that the EQR contacts 10a to 10d are held equipotential to the drain electrode 5, for example, through the base diffusion region 3 is targeted, the channel stopper layer 4 is not always required, and can be omitted.

The contour of the semiconductor device according to the above-described first to fourth embodiments is not limited to a rectangular shape. The contour of the semiconductor device according to the present invention can be shaped in such as an arbitrary polygon, circle or oval-shaped.

What is claimed is:

1. A semiconductor device comprising:
    a semiconductor body of a first conductivity type, having a first area and a second area, the first area being an active area in which transistor element including a source, a drain, and a gate is formed, the second area surrounding the first area, the semiconductor body having a quadrilateral shape in a plan view;
    an insulating film formed over the semiconductor body;
    an Equipotential Ring (EQR) electrode pattern formed in the insulating film to surround the active area, and having curved portions at corners of the quadrilateral shape;
    a first conductive strip connected to the source and formed in the insulating film in the active area;
    a first diffusion region of a second conductivity type which is opposite to the first conductivity type, formed in the semiconductor body and in the second area;
    a second conductive strip connected to the first diffusion region and the EQR electrode pattern,
    wherein the second conductive strip is covered with the insulating film, and is disposed in the second area of the semiconductor body,
    wherein the second conductive strip comprises a first second conductive strip and a second conductive strip, and
    wherein the first second conductive strip and the second second conductive strip are arranged to be in parallel or in different directions with respect to a normal direction to one of the curved portions of the EQR electrode.

2. The semiconductor device according to claim 1, further comprising:
    a gate electrode pattern formed over the insulating film in the second area,
    wherein the gate extends to the second area,
    wherein the gate electrode pattern connected to the gate in the second area.

3. The semiconductor device according to claim 2, wherein the gate electrode pattern surrounds the active area and is arranged between the EQR electrode pattern and the first area.

4. The semiconductor device according to claim 1, wherein the second conductive strip is selectively formed at the curved portions of the EQR electrode pattern, wherein the second conductive strip is disposed in the second area of the semiconductor body and outside the curved portions.

5. The semiconductor device according to claim 1, wherein a width of at least one of the second conductive strip is larger than a width of the first conductive strip.

6. The semiconductor device according to claim 1, wherein the second conductive strip are formed at each of the curved portions.

7. The semiconductor device according to claim 5, wherein a plurality of the second conductive strip is formed at each of the curved portions.

8. The semiconductor device according to claim 5, wherein the second conductive strips are formed in four corners of the EQR electrode pattern.

9. The semiconductor device according to claim 1, wherein a contact for the EQR electrode pattern has a rectangular shape having a long side extended from an outer periphery of the curved portions toward an end surface of the semiconductor body.

10. The semiconductor device according to claim 1, wherein each of the first conductive strip and the second conductive strip includes a tungsten plug.

11. The semiconductor device according to claim 1, wherein the EQR electrode pattern includes a polysilicon.

12. The semiconductor device according to claim 2, wherein the gate electrode pattern includes an aluminum.

13. The semiconductor device according to claim 1, wherein the second conductive strip is in contact with the first diffusion region of the second conductivity type and a second diffusion region of the first conductivity type, which are formed on an end of the semiconductor body, and the EQR electrode pattern is electrically coupled to an end surface of the semiconductor body through the second conductive strip and the first and second diffusion regions.

14. The semiconductor device according to claim 13,
    wherein the second diffusion region is formed above the first diffusion region,
    wherein each bottom surface of the second conductive strip is in contact with the first diffusion region, and
    wherein the second diffusion region is in contact with side surfaces of each of the second conductive strip.

15. The semiconductor device according to claim 1, wherein an upper surface of the second conductive strip is covered with another insulating film.

16. The semiconductor device according to claim 1, wherein an upper surface of the second conductive strip is lower than a first upper surface of the EQR electrode pattern, and the upper surface of the second conductive strip is higher than a second upper surface of the EQR electrode pattern.

17. The semiconductor device according to claim 1, wherein a lower surface of the second conductive strip is lower than an upper surface of the semiconductor body.

18. The semiconductor device according to claim 1, wherein the second conductive strip is embedded inside the insulating film.

19. The semiconductor device according to claim 1, wherein at least two sides of the second conductive strip are covered with the insulating film.

* * * * *